United States Patent [19]

McClure

[11] Patent Number: 5,568,073
[45] Date of Patent: Oct. 22, 1996

[54] DATA COMPARING SENSE AMPLIFIER

[75] Inventor: David C. McClure, Carrollton, Tex.

[73] Assignee: SGS-Thomson Microelectronics, Inc., Carrollton, Tex.

[21] Appl. No.: 172,853

[22] Filed: Dec. 22, 1993

[51] Int. Cl.$^6$ .............................. G01R 19/00; G11C 7/00
[52] U.S. Cl. ................. 327/51; 327/52; 327/57; 327/403
[58] Field of Search ....................... 307/530, 350, 307/355, 241, 242; 365/189.02, 205, 207, 230.02, 208; 327/51–57, 403–405, 63–71; 326/52–55

[56] References Cited

U.S. PATENT DOCUMENTS

| | | | |
|---|---|---|---|
| 3,252,011 | 5/1966 | Zuk | 326/55 |
| 4,041,326 | 8/1977 | Robinson | 326/52 |
| 4,494,019 | 1/1985 | Brown | 307/530 |
| 4,646,306 | 2/1987 | Davis et al. | 326/55 |
| 4,791,324 | 12/1988 | Hodapp | 365/208 |
| 4,821,239 | 4/1989 | Lev | 307/530 |
| 5,046,050 | 9/1991 | Kertis | 307/530 |
| 5,198,709 | 3/1993 | O'Connell | 326/55 |
| 5,218,246 | 6/1993 | Lee et al. | 327/64 |
| 5,294,847 | 3/1994 | Grossman et al. | 307/530 |
| 5,299,157 | 4/1994 | Kimura et al. | 365/207 |

*Primary Examiner*—Toan Tran
*Attorney, Agent, or Firm*—Theodore E. Galanthay; Lisa K. Jorgenson; Renee M. Larson

[57] ABSTRACT

According to the present invention, the delay associated with a logic stage external to a sense amplifier is eliminated by absorbing the logic state into the sense amplifier circuitry. The sense amplifier inputs are swapped based on a sense enable signal which may be a derivative signal of a Data In signal. The sense amplifier may sense continuously or it may be clocked. The sense enable circuitry may be applied to various types of sense amplifiers such as dynamic, current mirror, differential, cross coupled, and level shifting sense amplifiers.

20 Claims, 4 Drawing Sheets

DATA COMPARING SENSE AMPLIFIER

BACKGROUND OF THE INVENTION

1. Field of the Invention

The present invention relates generally to sense amplifiers, and more specifically to an improved data comparing sense amplifier for use in tag RAMs.

2. Description of the Prior Art

Cache memories are important elements of a typical cache system, and may be used as primary caches embedded in high performance microprocessors or as secondary caches external to the microprocessor. As microprocessors have achieved faster operating speed, the rate at which requested data must be supplied to them has corresponding increased. Cache memories typically have faster access times than main memory and thus are often used to quickly supply data requested by the microprocessor.

Tag RAMS form a key element of the typical cache system. The tag associated with a "line" of data, a block of data which can be one or several consecutive bytes or words of data, in the cache memory is stored in a tag RAM which holds the address locations of data stored in the cache memory. The tag RAM often has a valid bit which indicates whether data stored at a particular address location is valid or invalid. When the microprocessor requests information, a read signal is sent to both the main memory and the tag RAM. The tag RAM compares the requested memory address with the memory address of all data stored in the cache memory. If the requested memory address is in the tag RAM, a "hit" condition exists, and data from that location is gated from the cache memory to the microprocessor.

In a "hit" condition, the tag RAM generates a valid compare Match output signal and the cache memory gates the required data onto the data bus before the main memory can respond. In this way, the cache memory quickly supplies data to the microprocessor and microprocessor wait states are avoided. However, if the tag RAM's comparison operation indicates that the desired data is not stored in the cache memory, a "miss" condition exists, and the data must be supplied from the slower main memory. As a result, the microprocessor may have to idly wait several cycles before it receives the requested data. These unproductive cycles are referred to as "wait states".

As the above discussion on tag RAMs indicates, the compare circuitry of a tag RAM generates a compare Match output signal indicative of whether a "hit" or a "miss" condition exists. Typically, the tag RAM compare circuitry utilizes a sense amplifier in conjunction with one or more logic gates external to the sense amplifier to generate the match output signal. The sense amplifier takes an appropriate bit of an address contained in the cache memory and generates a data output signal. This data output signal is input to a subsequent logic gate, such as a XOR or XNOR gate, where it is gated with the corresponding bit of the address sought by the microprocessor. The output signal of the logic gate is a compare signal indicative of whether a bit of an address requested by the microprocessor matches a corresponding bit of an address stored in the cache memory. There are a plurality of sense amplifiers and associated external logic gates equal to the number of bits of the address sought by the microprocessor. While this scheme of sensing whether the cache memory has the requested data works quite well, the logic gate external to a sense amplifier represents an additional stage with attendant delay. Therefore, according to this method, there will be a delay associated with the sense amplifier as well as a delay associated with the external logic gate. These delays are undesirable, because they increase the time required for the tag RAM to generate the match output signal.

SUMMARY OF THE INVENTION

It would be advantageous in the art to reduce delays associated with logic gates external to sense amplifiers, especially logic gate delays associated with sense amplifiers in tag RAM compare circuitry.

Therefore, according to the present invention, the delay associated with a logic stage external to a sense amplifier is eliminated by absorbing the logic state into the sense amplifier circuitry. The sense amplifier inputs are swapped based on a sense enable signal which may be a derivative signal of a Data In signal. The sense amplifier may sense continuously or it may be clocked. The sense enable circuitry may be applied to various types of sense amplifiers such as dynamic, current mirror, differential, cross coupled, and level shifting sense amplifiers.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

Figure 1:
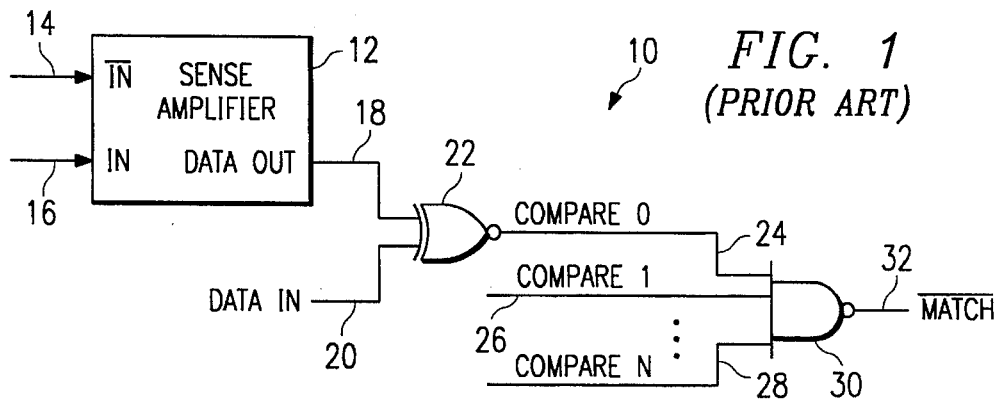
FIG. 1 is a schematic diagram of sense amplifier circuitry, according to the prior art.

Frequently, it is necessary to compare the output of a sense amplifier to another signal. Tag RAM compare circuitry is one example where such a comparison is commonly used. Referring to FIG. 1, sense amplifier circuitry 10, according to the prior art, is shown. Sense amplifier 12 has Data input signal 14 and Data Complement input signal 16 and produces Data Out signal 18. Data Out signal 18 and Data In signal 20 are both inputs signals to XNOR logic gate 22. Logic gate 22 may be other types of logic gates, such as a XOR gate. XNOR logic gate 22 generates Compare0 signal 24.

In tag RAM compare circuitry, a plurality of sense amplifiers 10 and corresponding XNOR gates 22, equal in number to the number of bits being compared, will each generate a compare signal analogous to Compare0 signal 24. As shown in FIG. 1, these signals are represented by Compare0 signal 24, Compare1 signal 26, etc., and CompareN signal 28. These compare signals are input signals to NAND logic gate 30 which produces Match Complement signal 32. When Data In signal 20 matches Data Out signal 18, Compare0 signal 24 is equal to 1; if all other compare signals fed to NAND logic gate 30, such as Compare1 and CompareN are also equal to 1, then Match Complement signal 32 is equal to 0 which is indicative of a match or "hit" condition. Table 1 illustrates the resulting truth table.

TABLE 1

| Data Out signal 18 | Data In signal 20 | Compare 0 signal 24 |
|---|---|---|
| 0 | 0 | 1 |
| 0 | 1 | 0 |
| 1 | 0 | 0 |
| 1 | 1 | 1 |

In the course of producing Match Complement signal 32, sense amplifier circuitry 10 incurs delay from sense amplifier 12, XNOR logic gate 22, and NAND logic gate 30. The delay introduced by these stages lengthens the time required to generate Match Complement signal 32. According to the present invention, the delay introduced by XNOR logic gate 22 is eliminated by combining the logic function of XNOR logic gate 22 with sense amplifier 12. This is done by effectively swapping the sense amplifier inputs based on the Data In signal or some sensing input.

Figure 2:
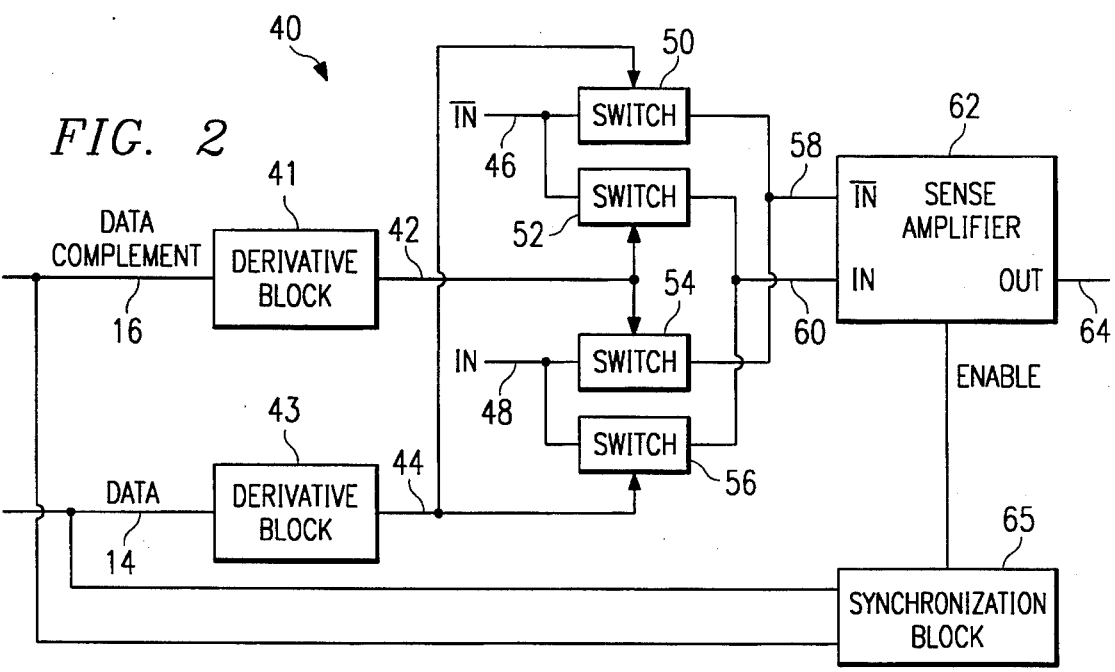
FIG. 2 is a block circuitry of sense amplifier circuitry, according to the present invention.

Referring to FIG. 2, a block diagram of sense amplifier circuitry 40 is shown. Data In Complement derivative signal 42 and Data In derivative signal 44 are derivative signals of the Data Complement input signal 16 and Data input signal 14, respectively, of FIG. 1. As shown in FIG. 2, then, Data Complement input signal 16 passes through Derivative Block 41 which produces Data In Complement derivative signal 42, and Data input signal 14 passes through Derivative Block 43 which produces Data In derivative signal 44. For instance, Data In derivative signal 44 may be equal to the Data input signal 14, or it may be representative of combining Data input signal 14 with another signal, such as a clock signal or address decoding logic inside Derivative Block 43.

The Data input signal 14 and Data Complement input signal 16 may be synchronized to the sensing operation of sense amplifier 62, and the synchronization may be accomplished by using an edge transition detection pulse (ETD), a master clock, or any other appropriate synchronization means as illustrated by Synchronization Block 65.

Data In Complement derivative signal 42 is an input signal to Switches 52 and 54, while Data In derivative signal 44 is an input signal to Switches 50 and 56, as shown. IN Complement signal 46 is an input signal to Switches 50 and 52, and IN signal 48 is an input signal to Switches 54 and 56. IN Complement signal 46 and IN signal 48 represent data from a memory array and form a differential signal pair. Switches 50, 52, 54, and 56 are blocks that may represent a variety of different switching devices, such as p-channel transistors. The outputs signals of Switches 50 and 54 are connected as shown to produce Sense Amplifier IN Complement signal 58 of sense amplifier 62. Similarly, the output signal of Switches 52 and 56 are connected as shown to produce Sense Amplifier IN signal 60 of sense amplifier 62. Upon receiving signals 58 and 60, sense amplifier 62 generates Sense Amplifier Out signal 64.

According to FIG. 2, when Data in derivative signal 44 is equal to 1, IN Complement signal 46 and IN signal 48 map to Sense Amplifier IN Complement signal 58 and Sense Amplifier IN signal 60, respectively. Sense Amplifier Out signal 64 has expected values. However, when Data in derivative signal 44 is equal to 0, IN Amplifier IN Complement signal 58, respectively, thereby swapping the sense of the data coming into sense amplifier 62. Thus, the truth table for sense amplifier circuitry 40 is represented below in Table 2 and is analogous to Table 1, without incurring the delay associated with an XOR or XNOR gate. For simplicity, the condition of IN signal 48 greater than IN Complement signal 46 is denoted by "1" and the condition of IN signal 48 less than IN Complement signal 46 is denoted by "0".

TABLE 2

| IN signal 48 | Data In derivative signal 44 | Sense Amplifier Out signal 64 |
|---|---|---|
| 0 | 0 | 1 |
| 0 | 1 | 0 |
| 1 | 0 | 0 |
| 1 | 1 | 1 |

Figure 3:
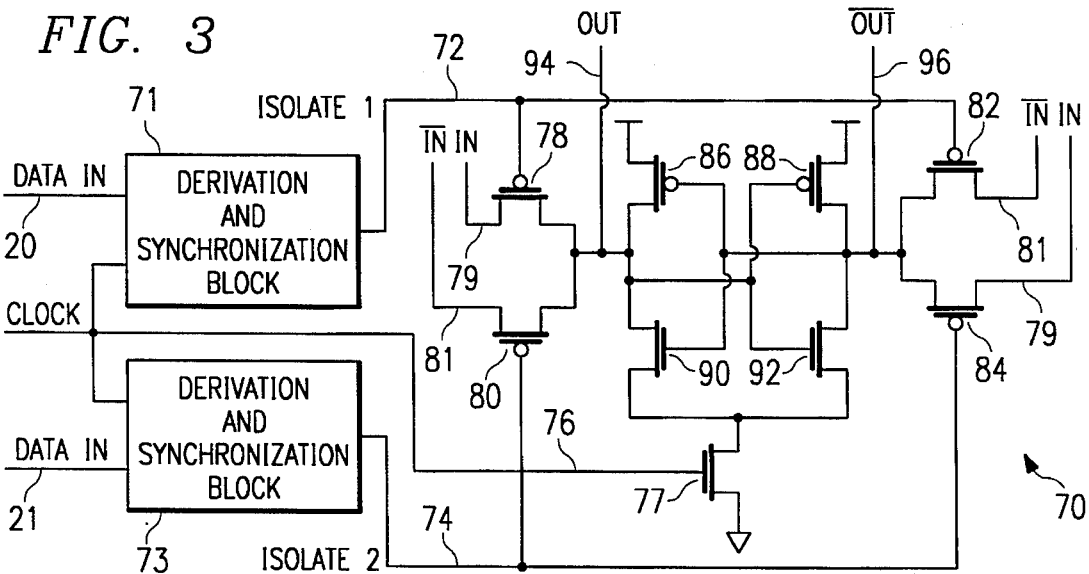
FIG. 3 is a schematic diagram of sense amplifier circuitry, according to a first preferred embodiment of the present invention.

The sense amplifier block circuitry of FIG. 2 may be implemented a number of ways. Referring to FIG. 3, a schematic diagram of sense amplifier circuitry, according to a first preferred embodiment of the present invention, is shown. Dynamic sense amplifier circuitry 70 incorporates the XOR or XNOR stage of the prior art into the sense amplifier circuitry. Isolate1 signal 72 and Isolate2 signal 74 are both derivative signals of a Data In signal, analogous to Data In signal 20 of FIG. 1. Thus, Data In signal 20 is an input signal to Derivative and Synchronization Block 71 which produces Isolate1 signal 72, and Data In bar signal 21, which is the inverse of Data In signal 20, is an input signal to Derivative and Synchronization Block 73 which produces Isolate2 signal 74 as shown in FIG. 3. Data In signal 20 and Data In bar signal 21 are synchronized to the sensing operation of dynamic sense amplifier circuitry 70, and the synchronization may be accomplished by using a edge transition detection pulse (ETD), a master clock, or any other appropriate synchronization means such as provided by Derivative and Synchronization Blocks 71 and 73, respectively.

Isolate1 signal 72 is fed to p-channel isolate transistors 78 and 82; Isolate2 signal 74 is fed to isolate transistors 80 and 84. Sense amplifier clock signal 76 is fed to the gate of transistor 77 which is connected to the common source/drain connection of transistors 90 and 92, as shown. IN signal 79 is fed to a source/drain connection of p-channel transistors 78 and 84; IN Complement signal 81 is fed to a source/drain connection of p-channel transistors 80 and 82, as shown. One source/drain of transistor 77 is connected to ground potential while the other source/drain connection is connected to the common source/drain connection of transistors 90 and 92, as shown. The other source/drain connection of transistors 90 and 92 are connected to the source/drain connections of transistors 86 and 88, respectively, which are also connected to power supply $V_{CC}$, as shown.

Transistors 86, 88, 90, and 92 are connected as shown, with the gates of transistors 86 and 90 connected to the common source/drain connection of transistors 88 and 92. Similarly, the gates of transistors 88 and 92 are connected to the common source/drain connection of transistors 86 and 90. Out signal 94 is connected to the node formed by the common source/drain connection of transistors 78 and 80, the common source/drain connection of transistors 86 and 90, and the common gate connection of transistors 88 and 92. Out Complement signal 96 is connected to the node formed by the common source/drain connection of transistors 82 and 84, the common source/drain connection of 88 and 92, and the common gate connection of transistors 86 and 90. While isolate transistors 78, 80, 82, and 84, as well as transistors 86 and 88 are p-channel transistors, they could also be n-channel transistors with minor appropriate changes to dynamic sense amplifier circuitry 70. Similarly, n-channel transistors 77, 90, and 92 could be replaced with p-channel transistors if minor circuitry changes were made.

As noted above, Isolate1 signal 72 and Isolate2 signal 74 are functions of a Data In signal analogous to Data In signal 20 of FIG. 1 which is not shown here. Isolate1 signal 72 goes to a logic low level to conduct when Data In signal is a logic high level. Isolate1 signal 72 goes to a logic high level as sense amplifier clock signal 76 is clocked high to latch the sense amplifier. Isolate1 signal 72 is a logic high level at all times that Data In signal is a logic low level. Conversely, Isolate2 signal 74 goes low to conduct when Data In signal is a logic low level, and goes high as sense amplifier clock signal 76 is clocked high to latch the sense amplifier. Isolate2 signal 74 is a logic high level whenever Data In is a logic high level.

The circuitry of FIG. 3 illustrates one sense amplifier structure for absorbing the XOR or XNOR stage of the prior art into a sense amplifier. The data inputs to dynamic sense amplifier circuitry 70, IN signal 79 and IN Complement signal 81, are effectively swapped based on the state of the Data In signal. As a result, the delay associated with the XOR or XNOR stage is not incurred. Additionally, the elimination of this logic stage saves layout time and area. FIG. 3 requires just two extra p-channel isolate transistors to generate Out signal 94 and Out Complement signal 96. Additionally, two isolate signals, rather than one, are used, and both Isolate1 signal 72 and Isolate2 signal 74 are functions of a Data In signal. Also, the circuitry of FIG. 3 utilizes sense amplifier clock signal 76 to re-clock the sense amplifier as needed based on the Data In signal changing state or a different memory cell being selected. However, these requirements do not introduce delay and thus do not adversely impact the speed of dynamic sense amplifier circuitry 70.

Figure 4:
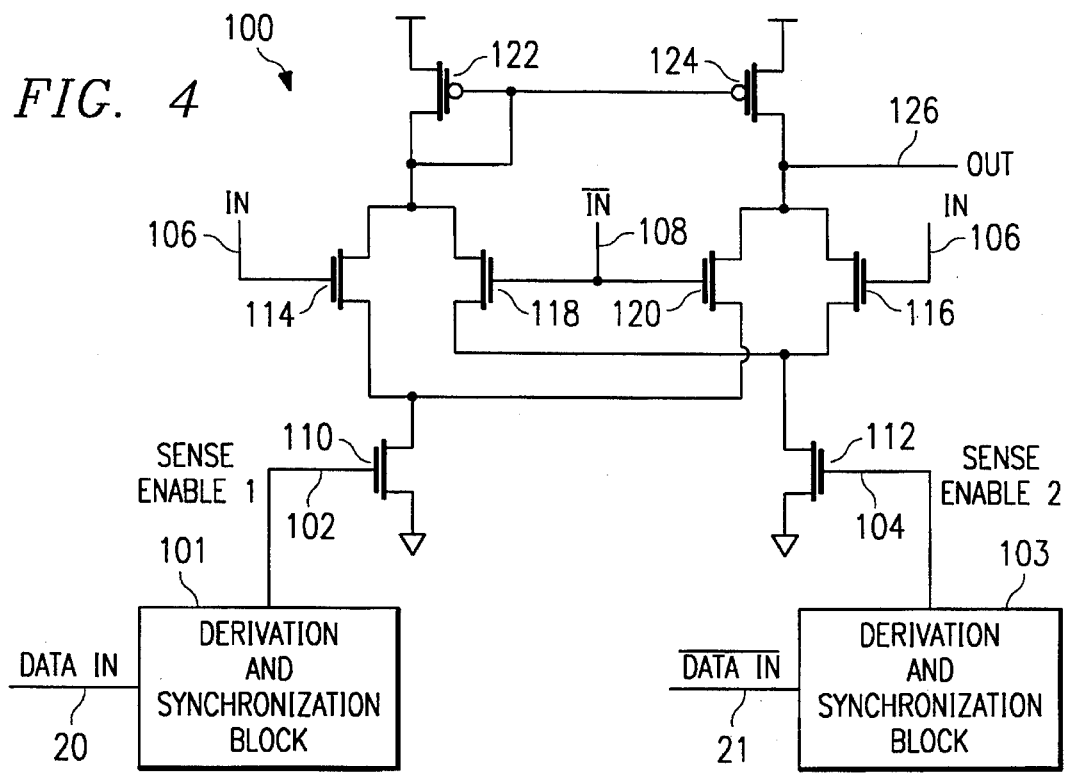
FIG. 4 is a schematic diagram of sense amplifier circuitry, according to a second preferred embodiment of the present invention.

Referring to FIG. 4, a second preferred embodiment of the present invention is shown. Current mirror sense amplifier circuitry 100 enables current sources as a function of a Data In Signal 20 which may be synchronized to the sensing operation of sense amplifier circuitry 100, and the synchronization may be accomplished by using a edge transition detection pulse (ETD), a master clock, or any other appropriate synchronization means as illustrated by Derivative and Synchronization Blocks 101 and 103, respectively. Sense Enable1 signal 102 and Sense Enable2 signal 104 are fed to current source n-channel transistors 110 and 112, respectively. A source/drain connection of transistor 110 is connected to the common source/drain connection of transistors 114 and 120, and a source/drain of transistor 112 is connected to the common source/drain connection of transistors 116 and 118, as shown. IN signal 106 is fed to the gates n-channel transistors 114 and 116, while IN Complement signal 108 is fed to the gates of n-channel transistors 118 and 120, as shown.

P-channel transistors 122 and 124 form the load of current mirror sense amplifier circuitry 100. The gates of p-channel transistors 122 and 124 as well as the source/drain connection of transistor 122 are connected to the common source/drain connection of transistors 114 and 118. A source/drain connection of both p-channel transistors 122 and 124 is connected to power supply $V_{CC}$. Out signal 126 is connected to the node formed by a source/drain of transistor 124 and the common source/drain connection of transistors 120 and 116. One skilled in the art will recognize that the transistors of FIG. 4 may be p-channel as well as n-channel, with minor changes to circuitry 100 without departing from the spirit of the invention.

Sense amplifier circuitry 100 absorbs the XOR and XNOR stage into the sense amplifier by enabling different current sources depending on the state of a Data In signal. The states of Sense Enable1 signal 102 and Sense Enable2 signal 104 are derivatives of a Data In signal, analogous to Data In signal 20 of FIG. 1. Thus, Data In signal 20 is an input signal to Derivative and Synchronization Block 101 which produces Sense Enable1 signal 102, and Data In signal 21, the inverse of Data In signal 20, is an input signal to Derivative and Synchronization Block 103 which produces Sense Enable2 signal 104 signal as shown in FIG 4. Sense Enable1 signal 102 can be a logic high level when the Data In signal is a logic high level causing current source transistor 110 to conduct, but will always be a logic low level when the Data In signal is a logic low level. Conversely, Sense Enable2 signal 104 can be a logic high level when the Data In signal is a logic low level causing current source transistor 112 to conduct, but will always be a logic low level when the Data In signal is a logic high level. This definition of Sense Enable1 signal 102 and Sense Enable2 signal 104 is arbitrary and may be fixed according to what is appropriate for a particular sense amplifier. The data inputs to sense amplifier circuitry 100, IN signal 106 and IN Complement signal 108, are effectively swapped based on the state of the Data In signal. Sense amplifier circuitry 100 constantly senses the state of the Data In signal and, contrary to the circuitry of FIG. 3, does not latch.

Figure 5:
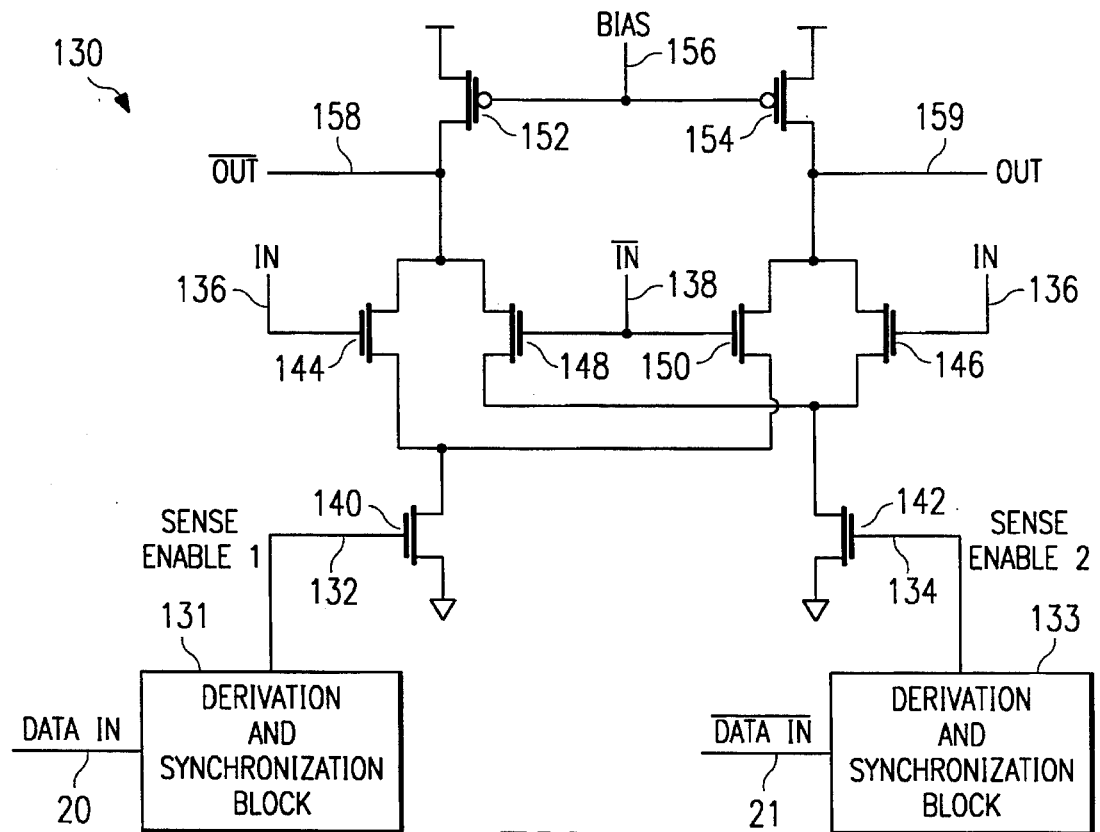
FIG. 5 is a schematic diagram of sense amplifier circuitry, according to a third preferred embodiment of the present invention.

Sense amplifier circuitry 100 may be adapted to various types of sense amplifiers, such as differential amplifiers and cross coupled amplifiers, while retaining the same sense enable control mechanism. Referring to FIG. 5, differential sense amplifier circuitry 130, according to a third preferred embodiment of the present invention, is shown. Differential sense amplifier circuitry 130 differs from sense amplifier circuitry 100 of FIG. 4 in that p-channel load transistors 122 and 124 have been replaced with p-channel load transistors 152 and 154, and bias signal 156 which is connected to the gates of p-channel load transistors 152 and 154 as shown. Additionally, there are two output signals: Out signal 159 and Out Complement signal 158.

Sense Enable1 signal 132 and Sense Enable2 signal 134 are fed to current source n-channel transistors 140 and 142, respectively. A source/drain of transistor 140 is connected to the common source/drain connection of transistors 144 and 150, and a source/drain of transistor 142 is connected to the common source/drain connection of transistors 146 and 148. IN signal 136 is fed to the gates of n-channel transistors 144 and 146, while IN Complement signal 138 is fed to the gates of n-channel transistors 148 and 150, as shown. The gates of p-channel transistors 152 and 154 are connected to each other and to bias signal 156. A source/drain connection of transistor 152 is connected to the common source/drain connection of transistors 144 and 148; the electrical node formed by this connection is represented by Out Complement signal 158. A source/drain connection of transistor 154 is connected to the common source/drain connection of transistors 146 and 150; the electrical node formed by this connection is represented by Out signal 159. A source/drain connection of both p-channel transistors 152 and 154 is connected to power supply $V_{CC}$. One skilled in the art will recognize that the transistors of FIG. 5 may be p-channel as well as n-channel, with minor changes to circuitry 130 without departing from the spirit of the invention.

Differential sense amplifier circuitry 130 absorbs the XOR and XNOR prior art stage into the sense amplifier by enabling different current sources depending on the state of a Data In signal. The states of Sense Enable1 signal 132 and Sense Enable2 signal 134 are derivatives of a Data In signal, analogous to Data In signal 20 of FIG. 1. Thus, Data In signal 20 is an input signal to Derivative and Synchronization Block 131 which produces Sense Enable1 signal 132, and Data In bar signal 21, the inverse of Data In signal 20, is an input signal to Derivative and Synchronization Block 133 which produces Sense Enable2 signal 134 as shown in FIG. 5. The Data In signal 20 and Data In signal 21 may be synchronized to the sensing operation of differential sense amplifier circuitry 130, and the synchronization may be accomplished by using a edge transition detection pulse (ETD), a master clock, or any other appropriate synchronization means as illustrated by Derivative and Synchronization Blocks 131 and 133, respectively. Sense Enable1 signal 132 can be a logic high level when the Data In signal is a logic high level, but will always be a logic low level when the Data In signal is a logic low level. Conversely, Sense Enable2 signal 134 can be a logic high level when the Data In signal is a logic low level, but will always be a logic low level when the Data In signal is a logic high level. The data inputs to differential sense amplifier circuitry 130, IN signal 136 and IN Complement signal 138, are effectively swapped based on the state of the Data In signal. Differential sense amplifier circuitry 130 constantly senses the state of the Data In signal and, contrary to the circuitry of FIG. 3, does not latch.

Figure 6:
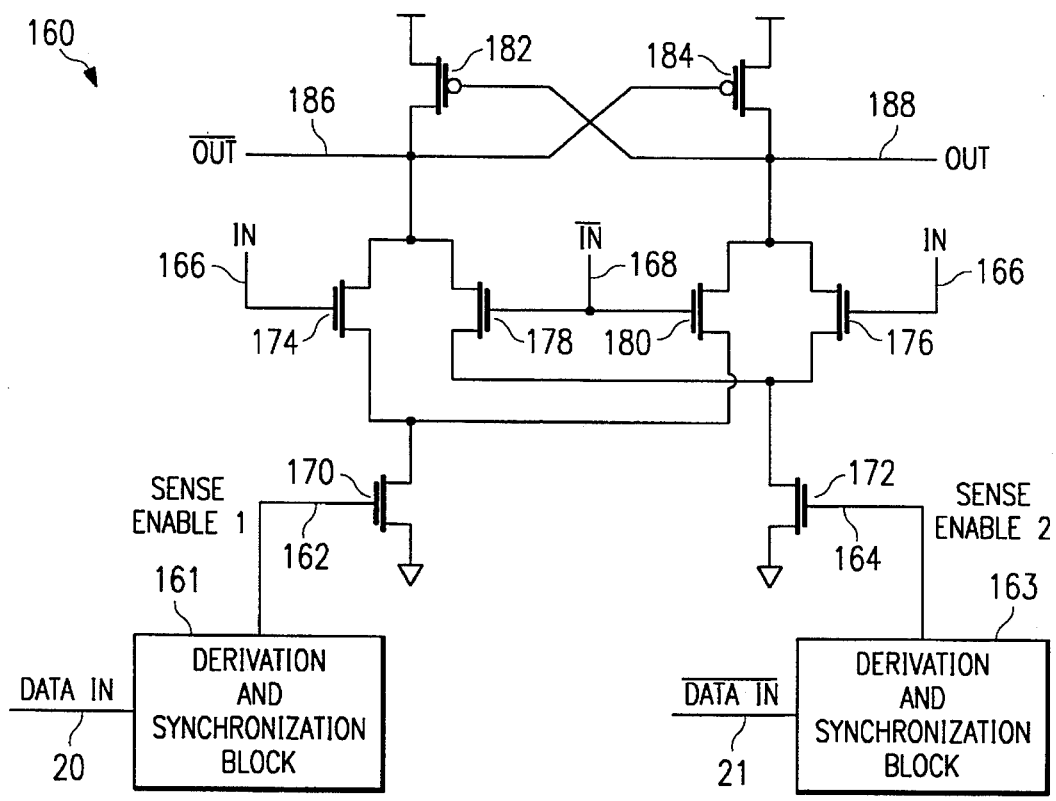
FIG. 6 is a schematic diagram of sense amplifier circuitry, according to a fourth preferred embodiment of the present invention.

Referring to FIG. 6, cross coupled sense amplifier circuitry 160, according to a fourth preferred embodiment of the present invention, is shown. Cross coupled sense amplifier circuitry 160 differs from sense amplifier circuitry 100 of FIG. 4 in that p-channel load transistors 122 and 124 have been replaced with cross coupled p-channel load transistors 182 and 184 as shown. Additionally, there are two output signals: Out signal 188 and Out Complement signal 186.

Sense Enable1 signal 162 and Sense Enable2 signal 164 are fed to current source n-channel transistors 170 and 172, respectively. A source/drain of transistor 170 is connected to the common source/drain connection of transistors 174 and 180, and a source/drain of transistor 172 is connected to the common source/drain connection of transistors 176 and 178. IN signal 166 is fed to the gates n-channel transistors 174 and 176, while IN Complement signal 168 is fed to the gates of n-channel transistors 178 and 180, as shown. P-channel transistors 182 and 184 are cross coupled such that the gate of p-channel transistor 182 is connected to a source/drain of p-channel transistor 184 and the common source/drain connection of n-channel transistors 176 and 180; Out signal 188 is represented by the electrical node defined by this connection. Similarly, the gate of p-channel transistor 184 is connected to a source/drain of p-channel transistor 182 and the common source/drain connection of n-channel transistors 174 and 178; Out Complement signal 186 is represented by the electrical node defined by this connection. A source/drain connection of both p-channel transistors 182 and 184 is connected to power supply $V_{CC}$. One skilled in the art will understand that the transistors of FIG. 6 may be p-channel as well as n-channel, with minor changes to circuitry 160 without departing from the spirit of the invention.

Cross coupled sense amplifier circuitry 160 absorbs the prior art XOR and XNOR stage into the sense amplifier by enabling different current sources depending on the state of a Data In signal. The Data In signal 20 and Data In bar signal 21 may be synchronized to the sensing operation of cross coupled sense amplifier circuitry 160, and the synchronization may be accomplished by using a edge transition detection pulse (ETD), a master clock, or any other appropriate synchronization means as illustrated by Derivative and Synchronization Blocks 161 and 163, respectively. The states of Sense Enable1 signal 162 and Sense Enable2 signal 164 are derivatives of a Data In signal, analogous to Data In signal 20 FIG. 1. Thus, Data In signal 20 is an input signal to Derivative and Synchronization Block 161 which produces Sense Enable1 signal 162, and Data In bar signal 21, the inverse of Data In signal 20, is an input signal to Derivative and Synchronization Block 163 which produces Sense Enable2 signal 164 as shown in FIG. 6. Sense Enable 1 signal 162 can be a logic high level when the Data In signal is a logic high level, but will always be a logic low level when the Data In signal is a logic low level. Conversely, Sense Enable2 signal 164 can be a logic high level when the Data In signal is a logic low level, but will always be a logic low level when the Data In signal is a logic high level. The data inputs to cross coupled sense amplifier circuitry 160, IN signal 166 and IN Complement signal 168, are effectively swapped based on the state of the Data In signal. Cross coupled sense amplifier circuitry 160 constantly senses the state of the Data In signal and therefore does not latch.

Figure 7:
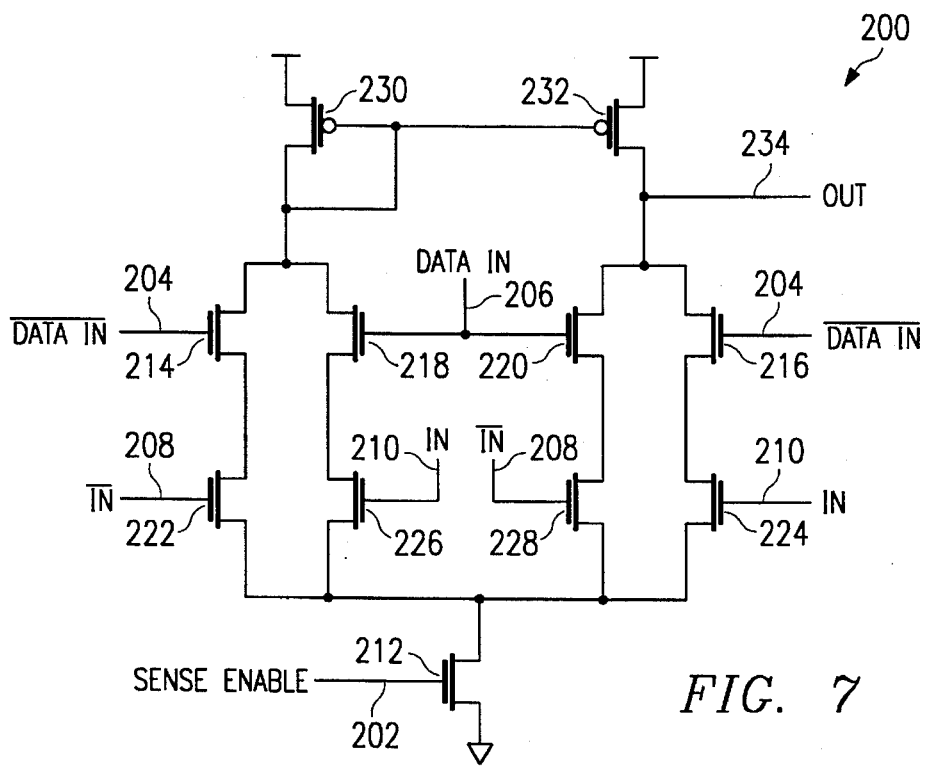
FIG. 7 is a schematic diagram of sense amplifier circuitry, according to a fifth preferred embodiment of the present invention.

The XOR or XNOR gate of the prior art may also be absorbed into the sense amplifier of a tag RAM using another current mirror scheme distinguished from FIG. 4. Referring to FIG. 7, current mirror sense amplifier 200, according to a fifth preferred embodiment of the present invention, is shown. Sense enable signal 202 is fed to n-channel transistor 212. Data In Complement signal 204 is fed to the gates of n-channel transistors 214 and 216 which form an enable pair of transistors; Data In signal 206 is fed to the gates of n-channel transistors 218 and 220 which form another enable pair of transistors, as shown. Thus, a difference between FIG. 4 and FIG. 7 is that transistors corresponding to Data In signal 206 and Data In Complement signal 204 have been added in series to transistors corresponding to In signal 210 and In Complement signal 208, respectively. Data In signal 206 and Data In Complement signal 204 are CMOS signals fed directly to sense amplifier circuitry 200 as shown. The Data In signal 206 and Data In Complement signal 204 may be synchronized to the sensing operation of circuitry 200, and the synchronization may be accomplished by using a edge transition detection pulse (ETD), a master clock, or any other appropriate synchronization means. IN signal 210 is fed to the gates of n-channel transistors 224 and 226, and IN Complement signal 208 is fed to the gates of n-channel transistors 222 and 228, as shown. N-channel transistors 226 and 228 form a differential pair of transistors, as do n-channel transistors 222 and 224.

The gates of p-channel load transistors 230 and 232 are connected to a source/drain of p-channel transistor 230 as well as the common source/drain connection of n-channel transistors 214 and 218. Out signal 234 is defined by the electrical node connecting a source/drain connection of p-channel transistor 232 to the common source/drain connection of n-channel transistors 216 and 220. A source/drain of transistors 214, 218, 220, 216 is connected to a corresponding source/drain of transistors 222, 226, 228, 224, respectively. The other source/drain of transistors 222, 226, 228, and 224 form a common source/drain connection which is connected to a source/drain of transistor 212, as shown. Like FIG. 4, current source sense amplifier 200 has just one output signal, Out signal 234, and is therefore not a differential output sense amplifier.

Sense enable signal 202 is not a function of a Data In signal and in that significant way, current mirror sense amplifier circuitry 200 differs from FIGS. 4, 5, and 6. When Sense Enable signal 202 is a logic high level, current mirror sense amplifier circuitry 200 senses, and the state of Data In signal 206 and Data In Complement signal 204 control n-channel transistors 218, 220 and 214, 216, respectively, to determine the state of Out signal 234. The data inputs to current mirror sense amplifier circuitry 200, IN signal 210 and IN Complement signal 208, are effectively swapped based on the state of the Data In signal. However, when Sense Enable signal 202 is a logic low level, current mirror sense amplifier circuitry 200 does not sense. Because current mirror sense amplifier circuitry 200 does not latch, it is contrary to circuitry 70 of FIG. 3.

Figure 8:
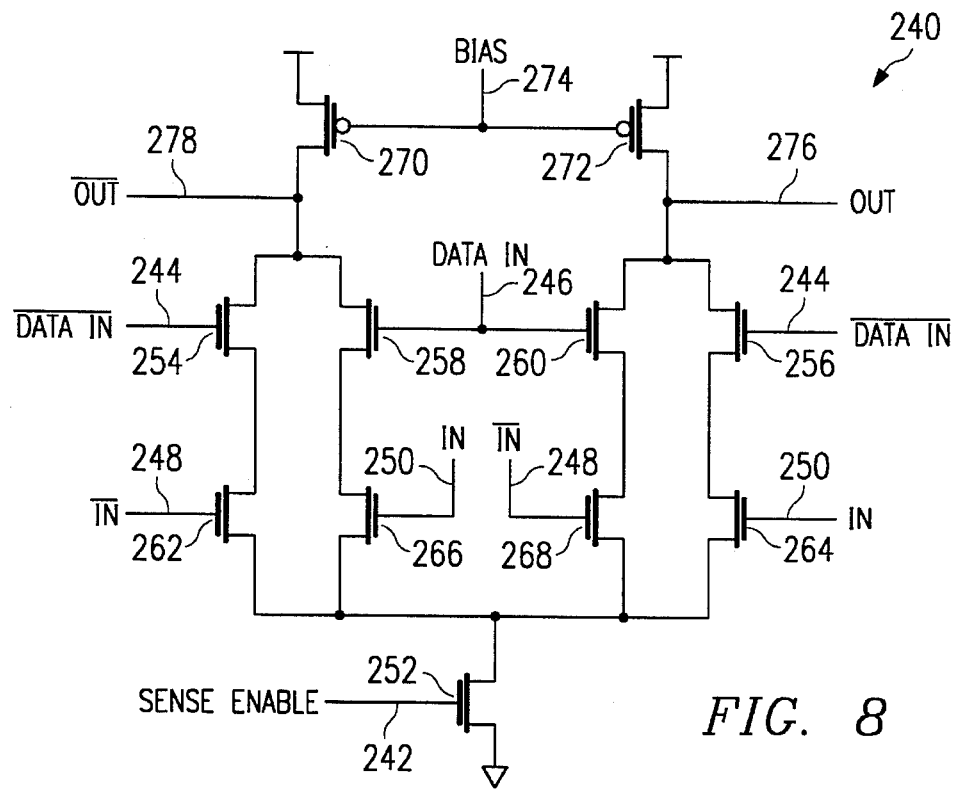
FIG. 8 is a schematic diagram of sense amplifier circuitry, according to a sixth preferred embodiment of the present invention.

The current mirror sense amplifier circuitry 200 may be adapted to various types of sense amplifiers, such as differential amplifiers and cross coupled amplifiers, while retaining the same sense enable control circuitry. Referring to FIG. 8, differential sense amplifier circuitry 240, according to a sixth preferred embodiment of the present invention, is shown. Differential sense amplifier circuitry 240 differs from current mirror sense amplifier circuitry 200 of FIG. 7 in that p-channel load transistors 230 and 232 have been replaced with p-channel load transistors 270 and 272, and bias signal 274 which is connected to the gates of p-channel load transistors 270 and 272 as shown. Additionally, there are two output signals: Out signal 276 and Out Complement signal 278; thus, differential sense amplifier circuitry 240 has differential output signals.

Sense enable signal 242 is fed to n-channel transistor 252 and is not a function of a Data In signal, as was in the case in FIGS. 4, 5, and 6. Data In Complement signal 244 is fed to n-channel transistors 254 and 256; Data In signal 246 is fed to the gates of n-channel transistors 258 and 260, as shown. Thus, a difference between FIG. 5 and FIG. 8 is that transistors corresponding to either Data In signal 246 or Data In Complement signal 244 have been added in series to transistors corresponding to In signal 250 and In Complement signal 248, respectively. The Data In signal 246 and Data In Complement signal 244 may be synchronized to the sensing operation of circuitry 240, and the synchronization may be accomplished by using a edge transition detection pulse (ETD), a master clock, or any other appropriate synchronization means. IN signal 250 is fed to the gates of n-channel transistors 264 and 266, and IN Complement signal 248 is fed to the gates of n-channel transistors 262 and 268, as shown.

A source/drain of p-channel transistor 270 is connected to the common source/drain connection of n-channel transistors 254 and 258. Out Complement signal 278 is represented by the electrical node defined by this connection. A source/drain of p-channel transistor 272 is connected to the common source/drain connection of n-channel transistors 256 and 260. Out signal 276 is represented by the electrical node defined by this connection. A source/drain of transistors 254, 258, 260, 256 is connected to a source/drain of transistors 262, 266, 268, 264, respectively. The other source/drain of transistors 262, 266, 268, and 264 form a common source/drain connection which is connected to a source/drain of transistor 252, as shown. A source/drain connection of both p-channel transistors 270 and 272 is connected to power supply $V_{CC}$. One skilled in the art will understand that the transistors of FIG. 8 may be p-channel as well as n-channel, with minor changes to circuitry 240, without departing from the spirit of the invention.

Differential sense amplifier circuitry 240 absorbs the XOR and XNOR stage of the prior into the sense amplifier. When Sense Enable signal 242 is a logic high level, differential sense amplifier circuitry 240 senses, and the state of Data In signal 246 and Data In Complement signal 244 control n-channel transistors 258, 260 and 254, 256, respectively, to determine the state of Out signal 272 and Out Complement signal 278. The data inputs to differential sense amplifier circuitry 240, IN signal 250 and IN Complement signal 248, are effectively swapped based on the state of the Data In signal. However, when Sense Enable signal 242 is a logic low level, differential sense amplifier circuitry 240 does not sense. Because differential sense amplifier circuitry 200 does not latch, it is different from circuitry 70 of FIG. 3.

Figure 9:
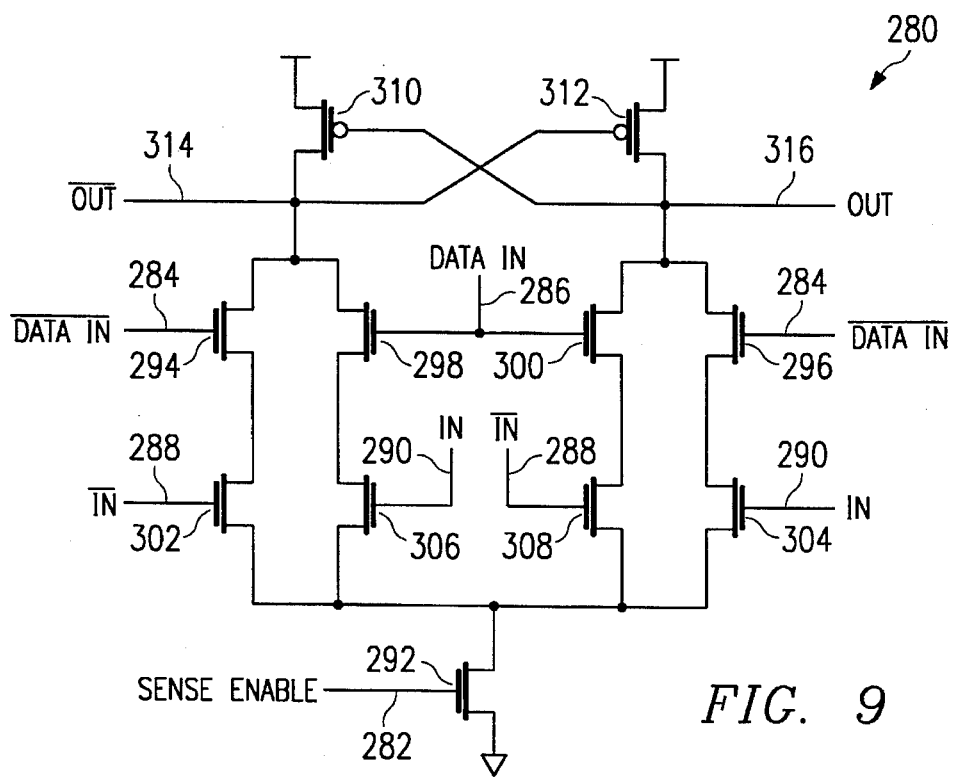
FIG. 9 is a schematic diagram of sense amplifier circuitry, according to a seventh preferred embodiment of the present invention.

Referring to FIG. 9, cross coupled sense amplifier circuitry 280, according to a seventh preferred embodiment of the present invention, is shown. Cross coupled sense amplifier circuitry 280 differs from circuitry 200 of FIG. 7 in that p-channel load transistors 230 and 232 have been replaced with cross coupled p-channel load transistors 310 and 312 as shown. Additionally, there are two output signals: Out signal 316 and Out Complement signal 314; thus cross coupled sense amplifier circuitry 280 has differential output signals.

Sense enable signal 282 is fed to n-channel transistor 292 and is not a function of a Data In signal, as was in the case in FIGS. 4, 5, and 6. Data In Complement signal 284 is fed to n-channel transistors 294 and 296; Data In signal 286 is fed to the gates of n-channel transistors 298 and 300, as shown. Thus, a difference between FIG. 6 and FIG. 9 is that transistors corresponding to Data In signal 286 and Data In Complement signal 284 have been added in series to transistors corresponding to In signal 290 and In Complement signal 288, respectively. The Data In signal 286 and Data In Complement signal 284 may be synchronized to the sensing operation of circuitry 280, and the synchronization may be accomplished by using a edge transition detection pulse (ETD), a master clock, or any other appropriate synchronization means. IN signal 290 is fed to the gates of n-channel transistors 304 and 306, and In Complement signal 288 is fed to the gates of n-channel transistors 302 and 308, as shown.

P-channel transistors 310 and 312 are cross coupled such that the gate of p-channel transistor 310 is connected to a source/drain connection of p-channel transistor 312 and the common source/drain connection of n-channel transistors 296 and 300; Out signal 316 is represented by the electrical node defined by this connection. Similarly, the gate of p-channel transistor 312 is connected to a source/drain connection of p-channel transistor 310 and the common source/drain connection of n-channel transistors 294 and 298; Out Complement signal 314 is represented by the electrical node defined by this connection. A source/drain of transistors 294, 298, 300, 296 is connected to a source/drain of transistors 302, 306, 308, 304, respectively. The other source/drain of transistors 302, 306, 308, and 304 form a common source/drain connection which is connected to a source/drain of transistor 292, as shown. A source/drain connection of both p-channel transistors 310 and 312 is connected to power supply $V_{CC}$. One skilled in the art will understand that the transistors of FIG. 9 may be p-channel as well as n-channel, with minor changes to circuitry 280, without departing from the spirit of the invention.

As in FIGS. 7 and 8, cross coupled sense amplifier circuitry 280 absorbs the XOR and XNOR stage of the prior into the sense amplifier. When Sense Enable signal 282 is a logic high level, circuitry 280 senses, and the state of Data In signal 286 and Data In Complement signal 284 control n-channel transistors 298, 300 and 294, 296, respectively, to determine the state of Out signal 316 and Out Complement signal 314. The data inputs to cross coupled sense amplifier circuitry 280, IN signal 290 and IN Complement signal 288, are effectively swapped based on the state of the Data In signal. However, when Sense Enable signal 282 is a logic low level, cross coupled sense amplifier circuitry 280 does not sense. Additionally, circuitry 280 differs from circuitry 70 of FIG. 3, because it does not latch.

The various embodiments described above all offer the advantage of eliminating delays associated with a logic gate stage external to the prior art sense amplifier by absorbing the function of the logic gate stage into the sense amplifier. The sense amplifier inputs, according to the present invention, are effectively swapped through multiplexing based upon a sense amplifier control signal, such as an enable or an isolate signal which may or may not be a derivative signal of a Data In signal. Such sense enable control circuitry may be applied to a variety of sense amplifiers, including differential sense amplifiers and cross coupled sense amplifiers.

In addition to the embodiments shown, the present invention may be utilized by simply placing a multiplexing device, such as a p-channel transistor or a column decode select transistor, in front of a standard sense amplifier so that data input signals, such as IN and IN complement, may be selectively passed or selectively passed and swapped to the inputs of the sense amplifier.

While the invention has been particularly shown and described with reference to a preferred embodiment, it will be understood by those skilled in the art that various changes in form and detail may be made therein without departing from the spirit and scope of the invention. For instance, the present invention may be applied to level shifting sense amplifiers. Additionally, one skilled in the art will recognize that the transistors described herein may be bipolar transistors having base, emitter, and collector connections rather than gate, source and drain connections.

What is claimed is:

1. Sense amplifier circuitry, comprising:

a sense amplifier having a first sense amplifier data input signal, a second sense amplifier data input signal, and a sense amplifier data output signal;

a first data signal, a second data signal, a third data signal, and a fourth data signal, wherein the first data signal and the second data signal are signals from a memory array;

a first control signal and a second control signal which are derivative signals of the third data signal and the fourth data signal, respectively; and a multiplexing circuit, which has the first data signal, the second data signal, the first control signal, and the second control signal as input signals and which generates the first sense amplifier data input signal and the second sense amplifier data input signal as output signals, wherein, the first control signal and the second control signal control the multiplexing circuit so that when the third data signal is equal to a predetermined logic state, the multiplexing circuit maps the first sense amplifier data input signal to the second data signal and the second sense amplifier data input signal to the first data signal, and when the fourth data signal is equal to the predetermined logic state, the multiplexing circuit maps the first sense amplifier data input signal to the first data signal and the second sense amplifier data input signal to the second data signal; and wherein the sense amplifier may be enabled and the enabling of the sense amplifier is synchronized to the third data signal and the fourth data signal, and wherein the enabling is synchronized by an edge transition detection (ETD) pulse.

2. Sense amplifier circuitry, comprising:

a sense amplifier having a first sense amplifier data input signal, a second sense amplifier data input signal, and a sense amplifier data output signal;

a first data signal, a second data signal, a third data signal, and a fourth data signal, wherein the first data signal and the second data signal are signals from a memory array, and wherein the sense amplifier may be enabled and the enabling of the sense amplifier is synchronized to the third data signal and the fourth data signal;

a first control signal and a second control signal which are derivative signals of the third data signal and the fourth data signal, respectively; and a multiplexing circuit, which has the first data signal, the second data signal, the first control signal, and the second control signal as input signals and which generates the first sense amplifier data input signal and the second sense amplifier data input signal as output signals, wherein, the first control signal and the second control signal control the multiplexing circuit so that when the third data signal is equal to a predetermined logic state, the multiplexing circuit maps the first sense amplifier data input signal to the second data signal and the second sense amplifier data input signal to the first data signal, and when the fourth data signal is equal to the predetermined logic state, the multiplexing circuit maps the first sense amplifier data input signal to the first data signal and the second sense amplifier data input signal to the second data signal; and wherein the sense amplifier may be enabled and the enabling of the sense amplifier is synchronized to the third data signal and the fourth data signal, and wherein the enabling is synchronized by a master clock signal.

3. Sense amplifier circuitry, comprising:

a first data signal, a second data signal, a third data signal, and a fourth data signal, wherein the first data signal and the second data signal are signals from a memory array;

a first control signal and a second control signal which are derivative signals of the third data signal and the fourth data signal, respectively, wherein the first control signal goes to a first predetermined logic level when the third data signal is equal to a second predetermined logic level and the second control signal goes to the first predetermined logic level when the fourth data signal is equal to the second predetermined logic level;

a clock signal; and a dynamic sense amplifier having the first data signal, the second data signal, the first control signal, the second control signal, and the clock signal as input signals, wherein the dynamic sense amplifier has a first isolate transistor, a second isolate transistor, a third isolate transistor, a fourth isolate transistor, a first transistor, a second transistor, and a third transistor, with each isolate transistor and each transistor having a first source/drain, a second source/drain, and a gate; a first output signal defined by the connection of the second source/drain of the first isolate transistor, the second source/drain of the third isolate transistor, and the first source/drain of the first transistor; a second output signal defined by the connection of the second source/drain of the second isolate transistor, the second source/drain of the fourth isolate transistor, and the first source/drain of the second transistor; wherein the first output signal is connected to the gate of the second transistor, the second output signal is connected to the gate of first transistor, the clock signal is connected to the gate of the third transistor, the second source/drain of the first transistor is connected to the second source/drain of the second transistor and the first source/drain of the third transistor, and the second source/drain of the third transistor is connected to a supply voltage; wherein the first data signal is connected to the first source/drain of the first isolate transistor and the first source/drain of the fourth isolate transistor, the second data signal is connected to the first source/drain of the second isolate transistor and the first source/drain of the third isolate transistor, the first control signal is connected to the gate of the first isolate transistor and the gate of the second isolate transistor, the second control signal is connected to the gate of the third isolate transistor and the gate of the fourth isolate transistor; and wherein the first control signal, the second control signal, and the clock signal control the dynamic sense amplifier so that when the third data signal is equal to a predetermined logic state the first isolate transistor and the second isolate transistor may conduct, and when the fourth data signal is equal to the predetermined logic state the third isolate transistor and the fourth isolate transistor may conduct;

wherein the third data signal and the fourth data signal are synchronized to the state of the first control signal, the second control signal, respectively, and the clock signal, and wherein the synchronization is synchronized by an edge transition detection (ETD) pulse.

4. Sense amplifier circuitry, comprising:

a first data signal, a second data signal, a third data signal, and a fourth data signal, wherein the first data signal and the second data signal are signals from a memory array;

a first control signal and a second control signal which are derivative signals of the third data signal and the fourth data signal, respectively, wherein the first control signal goes to a first predetermined logic level when the third data signal is equal to a second predetermined logic level and the second control signal goes to the first predetermined logic level when the fourth data signal is equal to the second predetermined logic level;

a clock signal; and a dynamic sense amplifier having the first data signal, the second data signal, the first control signal, the second control signal, and the clock signal as input signals, wherein the dynamic sense amplifier has a first isolate transistor, a second isolate transistor, a third isolate transistor, a fourth isolate transistor, a first transistor, a second transistor, and a third transistor, with each isolate transistor and each transistor having a first source/drain, a second source/drain, and a gate; a first output signal defined by the connection of the second source/drain of the first isolate transistor, the second source/drain of the third isolate transistor, and the first source/drain of the first transistor; a second output signal defined by the connection of the second source/drain of the second isolate transistor, the second source/drain of the fourth isolate transistor, and the first source/drain of the second transistor; wherein the first output signal is connected to the gate of the second transistor, the second output signal is connected to the gate of first transistor, the clock signal is connected to the gate of the third transistor, the second source/drain of the first transistor is connected to the second source/drain of the second transistor and the first source/drain of the third transistor, and the second source/drain of the third transistor is connected to a supply voltage; wherein the first data signal is connected to the first source/drain of the first isolate transistor and the first source/drain of the fourth isolate transistor, the second data signal is connected to the first source/drain of the second isolate transistor and the first source/drain of the third isolate transistor, the first control signal is connected to the gate of the first isolate transistor and the gate of the second isolate transistor, the second control signal is connected to the gate of the third isolate transistor and the gate of the fourth isolate transistor; and wherein the first control signal, the second control signal, and the clock signal control the dynamic sense amplifier so that when the third data signal is equal to a predetermined logic state the first isolate transistor and the second isolate transistor may conduct, and when the fourth data signal is equal to the predetermined logic state the third isolate transistor and the fourth isolate transistor may conduct;

wherein the third data signal and the fourth data signal are synchronized to the state of the first control signal, and the second control signal, respectively, and the clock signal, and wherein the synchronization is synchronized by a master clock signal.

5. Sense amplifier circuitry, comprising:

a first data signal, a second data signal, a third data signal, and a fourth data signal, wherein the first data signal and the second data signal are signals from a memory array;

a first control signal and a second control signal which are derivative signals of the third data signal and the fourth data signal, respectively; and a sense amplifier which has a first current source, a first differential pair of transistors comprised of a first transistor and a second transistor, a second current source, a second differential pair of transistors comprised of a third transistor and a fourth transistor, and a load element having a first connection point and a second connection point, with each transistor having a gate, a first source/drain, and a second source/drain; the first source/drain of the first transistor and the first source/drain of the third transistor are connected to the first connection point of the load element, the first source/drain of the second transistor and the first source/drain of the fourth transistor are connected to the second connection point of the load element, the second source/drain of the first transistor and the second source/drain of the second transistor are connected to the first current source, and the second source/drain of the third transistor and the second source/drain of the fourth transistor are connected to the second current source; wherein the first data signal is connected to the gate of the first transistor and the gate of the fourth transistor, the second data signal is connected to the gate of the second transistor and the gate of the third transistor, the first control signal controls the first current source so that when the third data signal is equal to a predetermined logic state the first current source may conduct, and the second control signal controls the second current source so that when the fourth data signal is equal to the predetermined logic state the second current source may conduct;

wherein the third data signal and the fourth data signal are synchronized to the state of the first control signal and the second control signal, respectively, and wherein the synchronization is synchronized by an edge transition detection (ETD) pulse.

6. Sense amplifier circuitry, comprising:

a first data signal, a second data signal, a third data signal, and a fourth data signal, wherein the first data signal and the second data signal are signals from a memory array;

a first control signal and a second control signal which are derivative signals of the third data signal and the fourth data signal, respectively; and a sense amplifier which has a first current source, a first differential pair of transistors comprised of a first transistor and a second transistor, a second current source, a second differential pair of transistors comprised of a third transistor and a fourth transistor, and a load element having a first connection point and a second connection point, with each transistor having a gate, a first source/drain, and a second source/drain; the first source/drain of the first transistor and the first source/drain of the third transistor are connected to the first connection point of the load element, the first source/drain of the second transistor and the first source/drain of the fourth transistor are connected to the second connection point of the load element, the second source/drain of the first transistor and the second source/drain of the second transistor are connected to the first current source, and the second source/drain of the third transistor and the second source/drain of the fourth transistor are connected to the second current source; wherein the first data signal is connected to the gate of the first transistor and the gate of the fourth transistor, the second data signal is connected to the gate of the second transistor and the gate of the third transistor, the first control signal controls the first current source so that when the third data signal is equal to a predetermined logic state the first current source may conduct, and the second control signal controls the second current source so that when the fourth data signal is equal to the predetermined logic state the second current source may conduct;

wherein the third data signal and the fourth data signal are synchronized to the state of the first control signal and the second control signal, respectively, and wherein the synchronization is synchronized by a master clock signal.

7. A sense amplifier, comprising:

a first data signal, a second data signal, a third data signal, and a fourth data signal, wherein the first data signal and the second data signal are signals from a memory array; and a sense amplifier which has a first differential pair of transistors comprised of a first transistor and a second transistor, a second differential pair of transistors comprised of a third transistor and a fourth transistor, a first enable pair of transistors comprised of a fifth transistor and a sixth transistor, a second enable pair of transistors comprised of a seventh transistor and an eighth transistor, and a load element having a first connection point and a second connection point, with each transistor having a gate, a first source/drain, and a second source/drain; the first source/drain of the first transistor is connected to the second source/drain of the fifth transistor, the first source/drain of the second transistor is connected to the second source/drain of the sixth transistor, the first source/drain of the third transistor is connected to the second source/drain of the seventh transistor, the first source/drain of the fourth transistor is connected to the second source/drain of the eighth transistor, the first source/drain of the fifth transistor and the first source/drain of the seventh transistor are connected to the first connection point of the load element, and the first source/drain of the sixth transistor and the first source/drain of the eighth transistor are connected to the second connection point of the load element; the first data signal is connected to the gate of the first transistor and the gate of the fourth transistor, the second data signal is connected to the gate of the second transistor and the gate of the third transistor, the third data signal is connected to the gate of the fifth transistor and the gate of the sixth transistor, and the fourth data signal is connected to the gate of the seventh transistor and the gate of the eighth transistor; wherein when the third data signal is equal to a predetermined logic state, the first differential transistor pair is connected to the load element, and when the fourth data signal is equal to the predetermined logic state, the second differential transistor pair is connected to the load element.

8. The sense amplifier of claim 7, wherein the load element is a current mirror.

9. The sense amplifier of claim 8, wherein the current mirror is comprised of a first p-channel transistor and a second p-channel transistor.

10. The sense amplifier of claim 7, wherein the sense amplifier is a differential sense amplifier, the load element is comprised of a first load transistor and a second load transistor, and a bias signal is connected to the gate of the first load transistor and the gate of the second load transistor.

11. The sense amplifier of claim 7, wherein the sense amplifier is a cross coupled sense amplifier, and the load element is a cross coupled pair of p-channel transistors.

12. The sense amplifier circuitry of claim 7, wherein the sense amplifier circuitry is suitable for use in a tag RAM compare circuit.

13. The sense amplifier circuitry of claim 7, wherein the first data signal and the second data signal form a differential signal pair.

14. The sense amplifier circuitry of claim 7, wherein the third data signal is the inverse of the fourth data signal.

15. The sense amplifier circuitry of claim 7, wherein the sense amplifier may be enabled and the enabling of the sense amplifier is synchronized to the third data signal and the fourth data signal.

16. The sense amplifier circuitry of claim 15, wherein the enabling is synchronized by an edge transition detection (ETD) pulse.

17. The sense amplifier circuitry of claim 15, wherein the enabling is synchronized by a master clock signal.

18. A sense amplifier, comprising:

a first data signal, a second data signal, a third data signal, and a fourth data signal, wherein the first data signal and the second data signal are signals from a memory array; and a sense amplifier which has a first differential pair of transistors comprised of a first transistor and a second transistor, a second differential pair of transistors comprised of a third transistor and a fourth transistor, a first enable pair of transistors comprised of a fifth transistor and a sixth transistor, a second enable pair of transistors comprised of a seventh transistor and an eighth transistor, and a load element having a first connection point and a second connection point, with each transistor having a first terminal, a second terminal, and a third terminal; the first terminal of the first transistor is connected to the second terminal of the fifth transistor, the first terminal of the second transistor is connected to the second terminal of the sixth transistor, the first terminal of the third transistor is connected to the second terminal of the seventh transistor, the first terminal of the fourth transistor is connected to the second terminal of the eighth transistor, the first terminal of the fifth transistor and the first terminal of the seventh transistor are connected to the first connection point of the load element, and the first terminal of the sixth transistor and the first terminal of the eighth transistor are connected to the second connection point of the load element; the first data signal is connected to the third terminal of the first transistor and the third terminal of the fourth transistor, the second data signal is connected to the third terminal of the second transistor and the third terminal of the third transistor, the third data signal is connected to the third terminal of the fifth transistor and the third terminal of the sixth transistor, and the fourth data signal is connected to the third terminal of the seventh transistor and the third terminal of the eighth transistor; wherein when the third data signal is equal to a predetermined logic state, the first differential transistor pair is connected to the load element, and when the fourth data signal is equal to the predetermined logic state, the second differential transistor pair is connected to the load element.

19. The sense amplifier of claim 18, wherein the load element is a current mirror, and the current mirror is comprised of a first bipolar transistor and a second bipolar transistor, and wherein the first terminal of the first bipolar transistor is a collector, the second terminal of the first bipolar transistor is an emitter, and the third terminal of the first bipolar transistor is a base; and the first terminal of the second bipolar transistor is a collector, the second terminal of the second bipolar transistor is an emitter, and the third terminal of the second bipolar transistor is a base.

20. The sense amplifier of claim 18, wherein the sense amplifier is a cross coupled sense amplifier, and the load element is a cross coupled pair of bipolar transistors.

* * * * *